United States Patent [19]
Fielding

[11] Patent Number: 4,721,840
[45] Date of Patent: Jan. 26, 1988

[54] COATED RESISTANCE WELDING SENSOR

[75] Inventor: Ralph H. Fielding, Troy, Mich.

[73] Assignee: Weltronic Company, Novi, Mich.

[21] Appl. No.: 820,528

[22] Filed: Jan. 17, 1986

[51] Int. Cl.⁴ .......................................... B23K 11/24
[52] U.S. Cl. .................................. 219/109; 219/110; 324/117 H
[58] Field of Search .............................. 219/109, 110; 324/117 H

[56] References Cited

U.S. PATENT DOCUMENTS

| | | | |
|---|---|---|---|
| 3,194,939 | 7/1965 | Hill | 324/117 H |
| 3,240,961 | 3/1966 | Noth | 219/110 |
| 3,562,124 | 2/1971 | Leon et al. | 428/457 |
| 3,870,987 | 3/1975 | Wiley et al. | 338/214 |
| 4,394,619 | 7/1983 | Gschwandtner | 324/117 H |
| 4,517,118 | 5/1985 | Stoetzer | 252/513 |

FOREIGN PATENT DOCUMENTS

| | | | |
|---|---|---|---|
| 228779 | 2/1969 | U.S.S.R. | 324/117 H |
| 461378 | 4/1975 | U.S.S.R. | 324/117 H |

*Primary Examiner*—Clifford C. Shaw
*Attorney, Agent, or Firm*—Harness, Dickey & Pierce

[57] ABSTRACT

The Hall effect current sensor is dipped in a coating of magnetically saturable and electromagnetically saturable material, such as a mixture of powdered nickel in an epoxy binder. The coating has little effect on the sensor's ability to sense the magnetic field attributable to current flow in the welding transformers primary or secondary. The coating shields the Hall effect device from potentially damaging electromagnetic radiation which is produced by the welding apparatus as a by-product of the welding operation.

12 Claims, 7 Drawing Figures

COATED RESISTANCE WELDING SENSOR

BACKGROUND AND SUMMARY OF THE INVENTION

The present invention relates generally to resistance welding and more particularly to a coated Hall effect sensor for measuring current flow in the welding apparatus.

Resistance welding is a process in which welding electrodes are placed in contact with a workpiece and then low-voltage, high-current pulsed electricity is made to flow between the electrodes and through the workpiece, causing intense heat in the workpiece which ultimately fuses the workpiece and causes a weld nugget to grow. The current is normally pulsed on for about one-third to one second and then off for typically one to twenty seconds, whereupon the cycle repeats. Conventionally, a current stepup transformer or welding transformer is used to develop the low-voltage, high-current electricity.

In order to control the quality of the weld and the rate of nugget growth, conventional resistance welding systems attempt to regulate the weld current by controlling the electrical energy fed into the primary of the welding transformer. The primary receives alternating current which is regulated by a phase-fired control circuit. A current sensor, responsive to either the primary or the secondary of the transformer, provides a feedback signal for controlling the firing angle of the control circuit to thereby control the weld current. Firing angles of between 70° and 120° are common. Typically, a resistance welding apparatus delivers welding current (secondary current) on the order of 5,000 to 30,000 amperes, with primary current in the 0 to 5,000 ampere range. To sense heavy current of this magnitude for feedback control purposes, a current transformer has traditionally been used. The current transformer is usually a wound toroidal coil for encircling the current carrying primary or secondary conductor. The current transformer is thus positioned in the magnetic field produced by the current flow and develops an induced current which is proportional to the magnetic field strength and, hence, proportional to the welding current.

One drawback of conventional current transformers is that they tend to be quite bulky and expensive, particularly those adapted for placement in the secondary circuit. The typical secondary circuit current transformer might measure four to twelve inches in diameter. Because they are bulky, current transformers are difficult to attach to multisecondary welding transformers or to welding transformers which are equipped with an integral welding gun. The integral welding gun and transformer package is highly desirable, since the heavy current carrying transformer secondary leads can be kept quite short, even where the control circuitry is at a remote location. Hence, the inability to work with these types of welding equipment is a serious shortcoming of the current transformer.

Another drawback of conventional current transformers is that they produce an output waveform which is proportional to the time derivative of the actual current waveform. This is an inherent property of inductive sensors of this type, which renders them inaccurate for use in phase-fired systems.

In nonwelding low current sensing applications, solid-state Hall effect devices have been employed to measure current. One could, for example, purchase a Hall effect device capable of measuring the comparatively small (by resistance welding standards) current flow in a household electric circuit. Hall effect devices are capable of being miniaturized and thus lend themselves well to confined space applications. However, Hall effect devices have heretofore been quite unreliable in resistance welding applications. In resistance welding applications, conventional Hall effect sensors have a very high failure rate; in field tests, Hall effect devices failed on an average of two per year per welding gun. The cause of this high failure rate has not heretofore been fully understood. In contrast, current transformers can operate for years without failure.

The inventor has discovered that a resistance welding apparatus radiates intense electromagnetic energy, primarily in the radio frequencies spectrum up to approximately 90 mHz., as a by-product of the welding operation, and that this energy may be the cause of high failure rate in Hall effect devices. The inventor has further discovered an extremely economical and highly effective solution to Hall effect device failure rate in the resistance welding environment.

The invention provides a sensor for measuring current in a current carrying component of a resistance welding apparatus comprising a Hall effect device for sensing the magnetic field produced by a current. The invention further provides a means for positioning the Hall effect device in the magnetic field of the current in a current carrying component of the resistance welding apparatus. A magnetically saturable or electromagnetically saturable coating is provided on the device for shielding the device from the intense electromagnetic energy produced as a by-product of the welding operation. The coating prevents the electromagnetic energy from damaging the Hall effect device and yet permits the device to measure current. The failure rate is greatly reduced. The magnetically saturable coating may be a ferromagnetic coating comprising a ferromagnetic material or mixture of ferromagnetic materials in powdered from suspended in a binder, such as epoxy. Mixtures of powdered nickel are particularly effective. The coating may be applied by dipping a commercially available Hall effect device in the coating mixture, or the coating may be fabricated as an integral part of the device.

According to the inventive method, the resistance welding current sensor is made by providing a Hall effect device, coating the device with a magnetically suturable coating, as by dipping, and positioning the coated device in a resistance welding apparatus where the device can receive magnetic energy from a current carrying component of the welding apparatus.

For a more complete understanding of the invention, reference may be had to the accompanying drawings and to the following specification.

DESCRIPTION OF A PREFERRED EMBODIMENT

Figure 1:
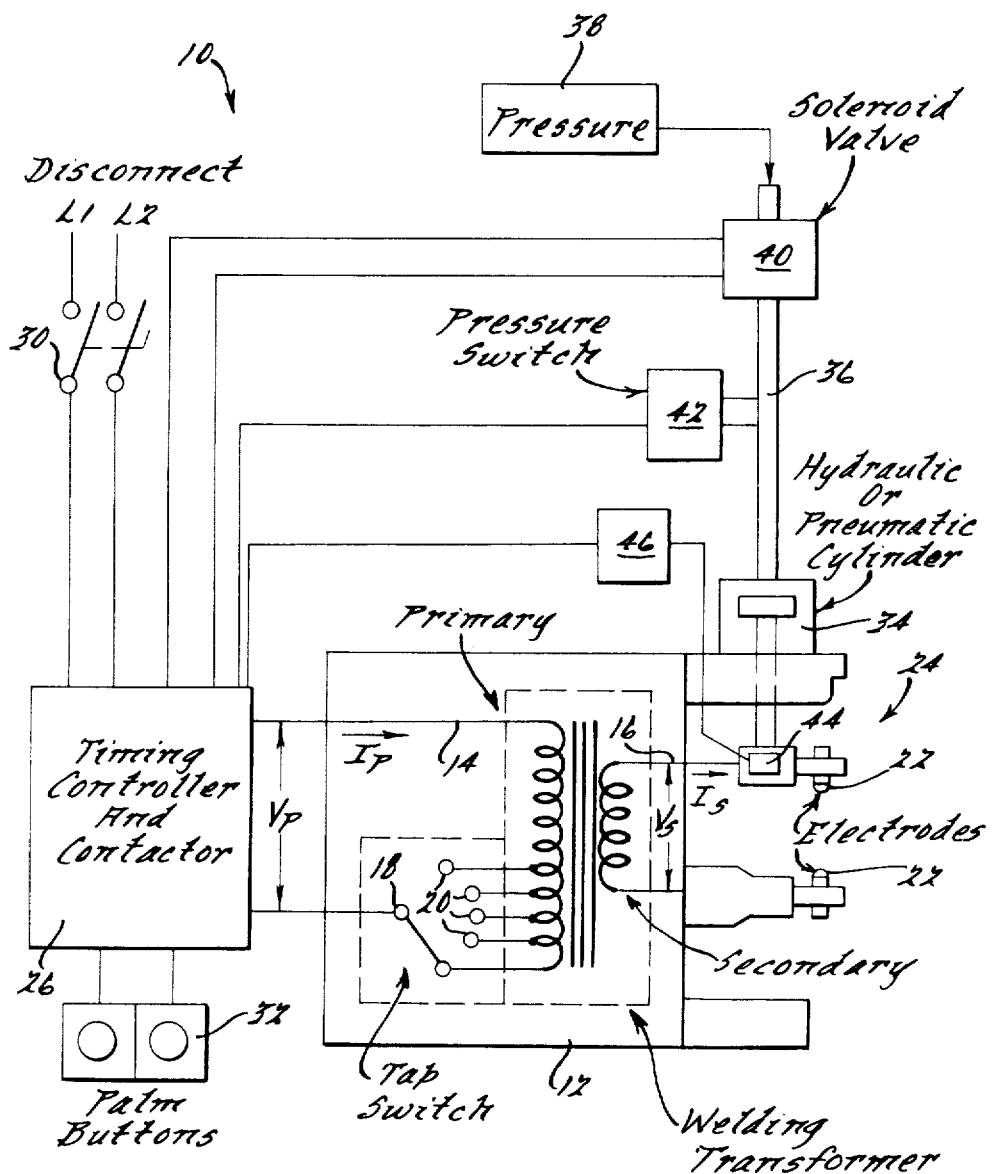
FIG. 1 is a schematic diagram of an exemplary resistance welding apparatus with which the invention may be used.

Referring to FIG. 1, an exemplary welding apparatus is illustrated generally at 10. The welding apparatus includes a welding transformer 12 which has a primary circuit 14 and a secondary circuit 16. The primary circuit includes a tap switch 18 for selecting one of a plurality of primary taps 20 used in selecting the appropriate number of primary turns as a means of selecting the appropriate voltage stepdown or current stepup ratio. Secondary circuit 16 is coupled to a pair of welding electrodes 22, which comprise part of the welding head or weld gun 24. The primary circuit is connected to timing controller and contactor circuit 26 which is receptive of alternating line current through bus L1 and L2. A disconnect switch 30 is connected to buses L1 and L2 for shutting down the welding apparatus. Timing controller and contactor 26 includes a pair of palm buttons 32 used in manually controlling the welding apparatus. In the alternative, the timing controller and contactor may be controlled by computerized circuitry for robotic operation.

One of the electrodes 22 is movably operated by an hydraulic or pneumatic cylinder 34. Cylinder 34 moves that electrode up and down between the open, workpiece entry and removal position and the closed, workpiece clamping and welding position. Cylinder 34 receives actuating pressure through pressure line 36. Pressure line 36 is coupled to pressure source 38 through solenoid valve 40. Solenoid valve 40 is electrically responsive to the timing controller and contactor 26. An electrically operable pressure switch 42 is also responsive to the timing controller and contactor 26 and is coupled to pressure line 36. Pressure switch 42 regulates the workpiece clamping pressure in response to electrical signals from controller 26.

In a resistance welding operation, a workpiece is placed between electrodes 22 while the electrodes are in the open position. The timing controller and contactor circuit then signals valve 40 to open, actuating cylinder 34 and causing the electrodes to squeeze together and clamp the workpiece at a predefined pressure determined by pressure switch 42. The timing controller and contactor 26 then energizes welding transformer 12 by applying a pulsed primary side voltage $V_p$ to the primary circuit 14, causing a pulsed primary current $I_p$ to flow in the primary circuit. Transformer 12 is a current stepup transformer which delivers a high amperage secondary current $I_s$ at a stepped down voltage $V_s$. The secondary current or weld current flows through the electrodes and workpiece, creating intense heat which melts and fuses the workpiece in the electrode vicinity. As current continues to flow, the melted region or nugget increases in size. When the optimum nugget size is attained, the weld current is switched off and the electrodes remain in the closed position for a predetermined time thereafter to provide mechanical stability while the weld cools. Then the cylinder 34 is de-energized to open the electrodes, whereupon the workpiece may be removed.

In order to ensure that nugget growth proceeds at the optimum rate and in order to determine when the proper nugget size is reached, the weld current is sensed as a function of time on either the primary or secondary side of transformer 12. The sensed current is indicative of the nugget growth, as a function of time. Hence, the sensed current may be used as a feedback signal to provide the timing controller and contactor 26 with nugget growth information. The feedback signal may be used, for example, to control the firing angle of a phase-fired circuit in the timing controller and contactor. By controlling the firing angle, the phase-fired circuit controls the amount of electrical energy delivered to primary circuit 14. The weld current energy on the secondary side of transformer 12 is directly proportional to the energy input at the primary side. Hence, by controlling the firing angle, the weld current and thus nugget growth is controlled.

In accordance with the invention, a current sensor 44 is positioned adjacent one of the current carrying conductors of the welding apparatus 10, so that it may receive magnetic energy from the magnetic field which surrounds the current carrying conductor. For purposes of illustrating the principles of the invention, FIG. 1 illustrates sensor 44 positioned on one of the secondary transformer lugs. Sensor 44 is connected to interface conditioning circuit 46, which is in turn connected to the timing controller and contactor 26. While the sensor 44 is presently illustrated on the secondary side of transformer 12, the invention also permits the sensor to be placed on the primary side of transformer 12. The details of sensor 44 and interface conditioning circuit 46 are discussed more fully below. Briefly, sensor 44 is a Hall effect device which has been specially treated with a saturable magnetic coating to protect it from becoming damaged in the high energy environment. Interface conditioning circuit 46 amplifies and balances the sensor output signal, allowing the sensor to be located a great distance from the processing circuitry of timing controller and contactor 26. Unlike conventional current transformer sensors, which produce a time derivative output signal, the Hall effect sensor 44 produces a waveform which is directly proportional to the welding current waveform. Since the Hall effect sensor produces a proportional replica of the welding current waveform, its output signal is accurate for controlling phase-fired circuits. The outputs of conventional current transformers must be integrated with respect to time in order to derive the actual welding current waveform. Conventional current transformers are not accurate in controlling phase-fired circuits.

In addition to providing feedback control, the weld current sensor 44 and interface conditioning circuit 46 is also capable of providing accurate time domain data for weld documentation purposes. The ability to provide accurate weld current information is important in industrial and manufacturing applications where weld data is needed for quality control purposes. The weld data can also be compared with programmed limits and used to reject a faulty weld on line if the weld data is not within the programmed limits.

Figure 2:
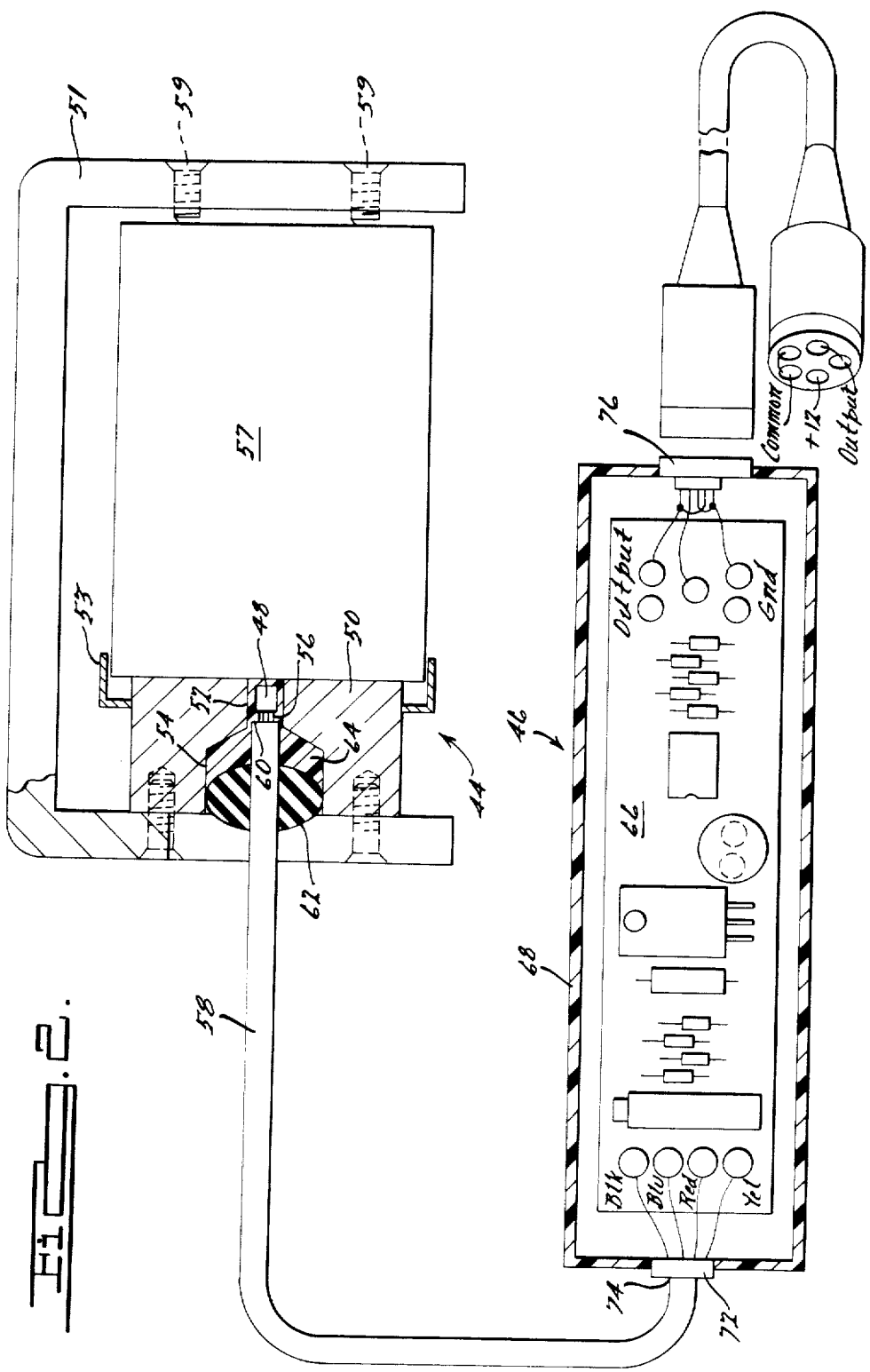
FIG. 2 is a cross-sectional view of the sensor of the invention with its associated electronic interface package.

Referring now to FIG. 2, a presently preferred Hall effect sensor and interface conditioning circuit packaging is illustrated. The Hall effect sensor 44 comprises a Hall effect semiconductor 48 which is treated with a magnetically saturable coating (described below) and bonded to a mounting fixture 50. Preferably, mounting fixture 50 is a block or plate of nonferrous material, such as copper or plastic. Fixture 50 has a pair of coaxial bores 52 and 54. Hall effect device 48 is positioned within bore 52 with its four leads 56 extending upwardly through bore 54. The Hall effect device is positioned at an orientation so it will receive proper exposure to the magnetic field of the current carrying component when installed in the welding apparatus. Preferably, leads 56 are encased in a flexible jacket or tubing 58. The proximal end 60 of tubing 58 is inserted in grommet 62 and extends into bore 52. Bores 52 and 54 are filled with epoxy 64 which secures Hall effect device 48 within bore 52 and also secures leads 56, tubing 58 and grommet 62 within bore 54. The resulting Hall effect sensor 44 is thus neatly packaged with the delicate Hall effect device 48 and leads 56 protected from mechanical damage. As an alternative to epoxy, the Hall effect device, leads and grommet may also be secured with other types of adhesives, such as acrylic-based adhesives.

Fixture 50 is secured to a U-shaped mounting bracket 51 with screws or the like. Preferably, bracket 51 is of a nonferrous material, such as copper. Attached to fixture 50 is a sensor head locating plate 53 which is adapted to embrace the transformer lug 57. Set screws 59 are used to secure the assembly in place. Locating plate 53 ensures that the Hall effect device is at the proper physical orientation to receive proper exposure to the magnetic field surrounding lug 57.

Interface conditioning circuit 46 is constructed on a printed circuit board 66 which is housed within a protective enclosure 68. Enclosure protects the electronics from physical damage and is preferably metal to provide shielding. Secured to one end of enclosure 68 is a grommet 72 which receives the distal end 74 of tubing 58. Leads 56 are soldered to printed circuit board 66 as illustrated. A jack or socket 76 is secured to the opposite end of enclosure 68. Socket 76 is wired to the printed circuit board 66 as illustrated and provides the appropriate connections for attaching to a plug, data cable or to the timing controller and contactor circuit 26. As illustrated, the preferred cable provides signal and common pins as well as a 12-volt power supply lead for furnishing power to circuit 46.

Figure 3:
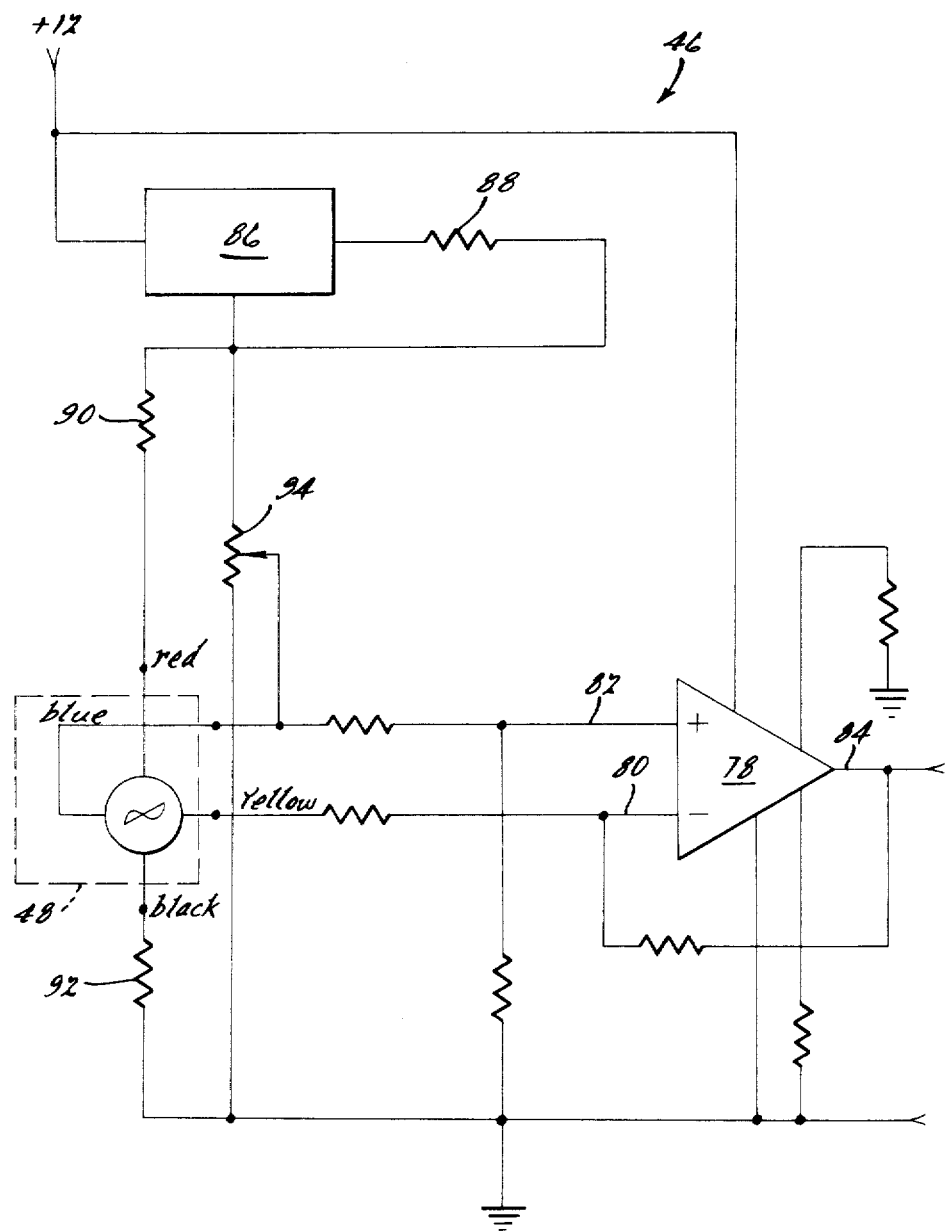
FIG. 3 is a schematic diagram of the electronic interface circuit used with the sensor of the invention.

FIG. 3 illustrates the presently preferred interface conditioning circuit 46. Circuit 46 comprises an operational amplifier 78, such as a 741 integrated circuit which has inverting and noninverting inputs 80 and 82, respectively, and output 84. The output terminals (blue and yellow) of Hall effect device 48 are coupled to the inputs 80 and 82. Bias current is supplied to the Hall effect device via the bias leads (red and black). A voltage regulator 86, such as an LM317 integrated circuit and resistors 88, 90 and 92 supply and control the bias current. A potentiometer 94 is coupled between the voltage regulator 86, positive Hall effect output lead and ground. Potentiometer 94 serves as a balancing potentiometer so that the positive and negative readings are centered or balanced relative to ground. The operational amplifier allows the Hall effect device 48 to be located a great distance from the processing circuitry, matches the impedance of the Hall effect device with the processing circuitry, allows the Hall effect device output to be balanced relative to ground and amplifies the signal for improved signal-to-noise ratio.

To protect the Hall effect device from damage by electromagnetic energy (heretofore unrecognized as the cause of high failure rate) and to extend the useful life of the Hall effect device, the device is coated with a magnetically saturable coating. Preferably, the Hall effect device 48 is dipped in a coating material preferably comprising a mixture of powdered metal in an epoxy binder.

Figure 6:
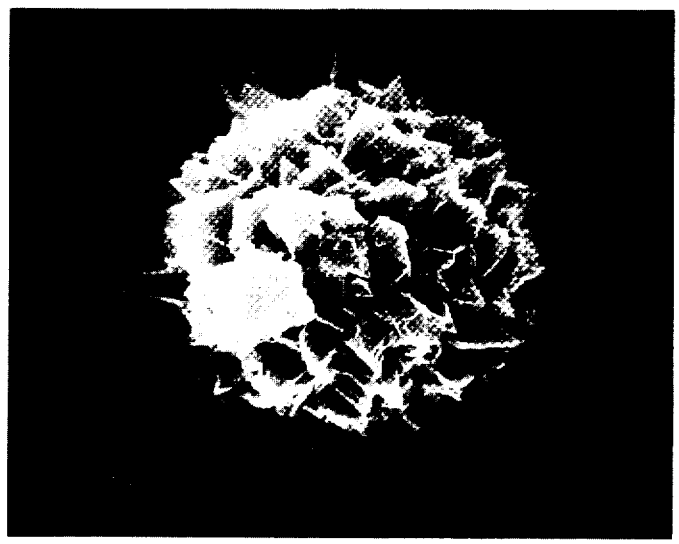
FIG. 6 is a scanning electron micrograph of type 123 Nickel Powder at magnification of 4800; this powder is one constituent of the presently preferred magnetically saturable coating.
Figure 7:
FIG. 7 is a scanning electron micrograph of type 255 Nickel Powder at a magnification of 7500; this powder is another constituent of the presently preferred magnetically saturable coating.

A presently preferred coating comprises a mixture by weight of one ounce of powdered metal A with 0.25 ounce of powdered metal B. Powdered metal A is INCO Nickel Powder type 255 and powdered metal B is INCO Nickel Powder type 123. Table I sets forth a typical chemical analysis and the typical physical properties of both of these powdered metals. FIG. 6 depicts type 123 Nickel Powder at a magnification of 4800 and FIG. 7 depicts type 255 Nickel Powder at a magnification of 7500. As seen, the type 123 Powder has an egg-shaped, clumped configuration, whereas type 255 powder has an elongated, filamentary or chainlike configuration. The clumped configuration is believed to be responsive to high-frequency electromagnetic energy, while the filamentary configuration is responsive to lower frequency electromagnetic energy.

TABLE I

| Specifications Powdered Metals A & B | |
|---|---|
| Powder metal A is INCO Nickel Powder type 255 | |
| Typical Chemical Analysis: | |
| Carbon | <.25 |
| Sulfur | <.001 |
| Iron | <.01 |
| Oxygen | <.15 |
| Nickel | Balance |
| Typical Physical Properties: | |
| Average particle size | 2.2–2.8 microns. |
| Apparent density | .5–.65 g/cc |
| Note: Particle size is the typical diameter of a particle. Because these filamentary powders are spikey spheres bonded together in a chainlike structure, the actual length is variable and difficult to determine. Microscopic examination has revealed chains of from 20 to 60 diameters in length. (44–168 microns) | |
| Powdered Metal B is INCO Nickel Powder type 123 | |
| Typical Chemical Analysis: | |
| Carbon | <.1 |
| Oxygen | <.15 |
| Sulfur | <.001 |
| Iron | =<.01 |
| Nickel | Balance |
| Typical Physical Properties: | |
| Typical particle size | 3–7 microns |
| Both the above materials are produced by carbonyl refining processes whereby Nickel Carbonyl is converted to Nickel Powder. | |
| INCO Nickel powder is available from International Nickel, Suffern, New York. | |

The preferred coating material is prepared by mixing powdered metals A and B in the proportions specified above in a solution of isopropyl alcohol to remove any factory residue. The mixture is then poured through a strainer and allowed to dry. The metal mixture is then remixed on a Morgan hot plate which has been set to the COLD setting. Over a period of one hour, the temperature of the hot plate is raised from ambient up to 340° C. The 340° C. temperature is retained for a period of 10–15 minutes. Thereafter, the temperature is lowered to 150° C. and retained for one hour. Next, the hot plate is turned off and allowed to cool back to ambient temperature. Ambient temperature may be room temperature. The mixture is then added to 24 ounces of 3M Epoxy No. 3047. The mixture with epoxy added is stirred with a No. 17 beater at 100 RPM for 30 minutes. Next, 4 ounces of No. 3047 thinner is added and the mixture with thinner added is stirred as above but at 400 RPM for an additional 30 minutes. Four ounces by weight of pure calcium is added while stirring. The coating material is now ready for use.

Once the coating material is ready for use, the Hall effect device 48 is suspended by its leads 56 and dipped into the coating material. The coating is allowed to adhere to the Hall effect device and also to at least a portion of the leads. A coating thickness of approximately 0.005 inches will provide protection from damage in the high-energy environment while permitting the device to sense current accurately. Preferably, when using nickel, the coating thickness should be kept below 0.02 inches for optimum results.

While the foregoing is exemplary of the presently preferred coating material. Other mixtures and preparations may also be used to achieve the desired result of protecting the Hall effect device from damage due to high-energy electromagnetic radiation. The adhesive binder, for example, may be any adhesive which does not become brittle or fully hardened. In addition to the powder metals disclosed above, other ferrous metals, ferromagnetic or ferrimagnetic materials may be used as well. In so doing, the powder metals should preferably be mixed together and heated to a temperature just below the Curie temperature, or the paramagnetic temperature.

Figure 4:
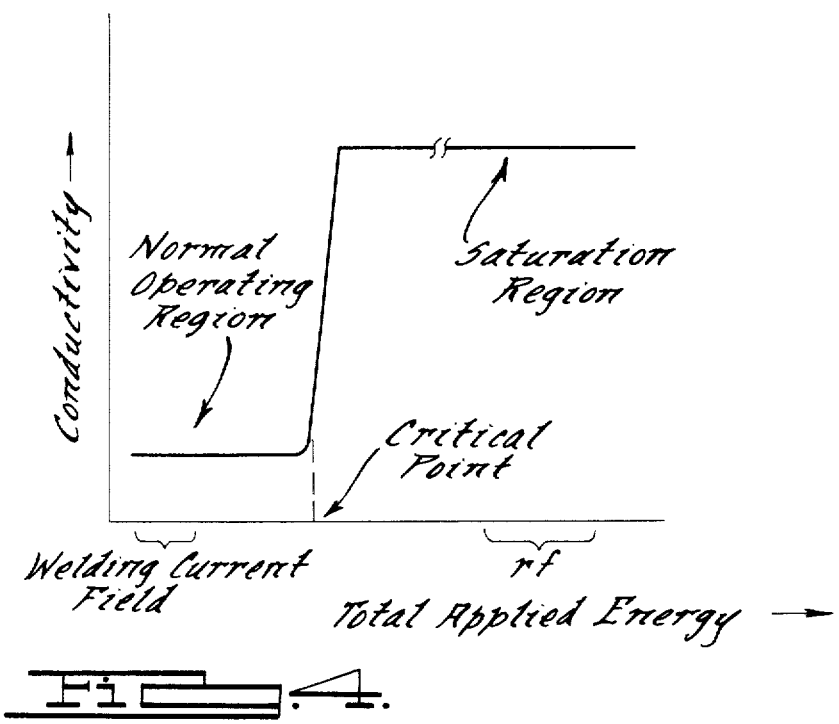
FIG. 4 is a graph depicting the conductivity and other principles of the magnetically saturable coating.
Figure 5:
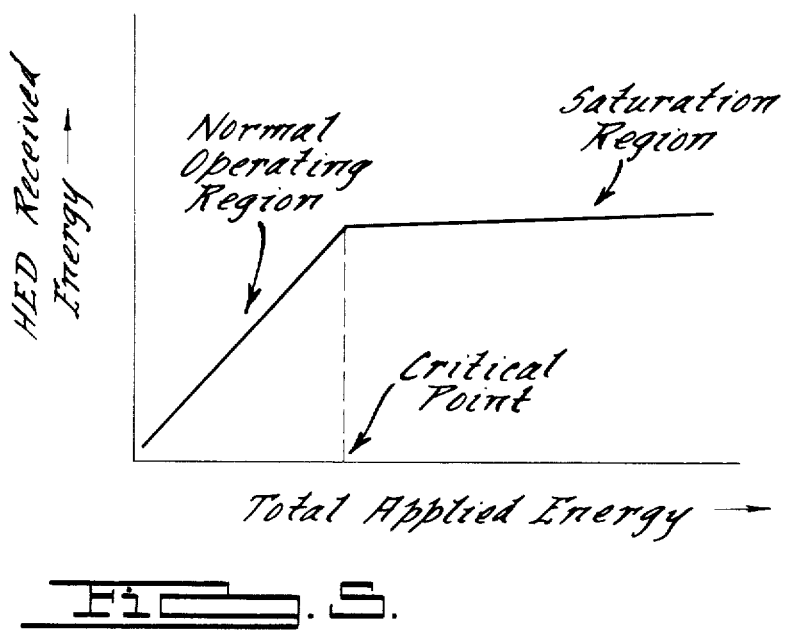
FIG. 5 is a graph depicting the energy reserved by the Hall effect device as a function of total applied energy.

The coating exhibits magnetic and electromagnetic saturation characteristics exhibited generally by the curves of FIGS. 4 and 5. At low magnetic field strengths, typically below 5000 Gauss, the coating has comparatively low conductivity and little effect on the ability of the Hall effect device to sense the magnetic field. When using nickel at coating thicknesses in excess of approximately 0.02 inches, the coating begins to affect the magnetic field strength sensed by the Hall effect device by concentrating the flux in the vicinity of the device. Thus, unless increased sensitivity is desired, coating thicknesses should be kept below 0.02 inches. As illustrated by the curves in FIGS. 4 and 5, the effect of the coating is linear in the normal operating region and fairly minimal below approximately 5000 Gauss. Above 5000 Gauss, typically in the 6,000 to 10,000 Gauss range, a critical point is reached at which the coating becomes highly magnetically and electromagnetically conductive or saturated. In this saturation region, the coating permits only a certain clipped level of energy to reach to Hall effect device and thereby shields the Hall effect device from potentially damaging magnetic and electromagnetic fields. In this saturation region, the coating acts as an absorber of radio frequency electromagnetic energy. This performance is believed to be quite important in protecting the Hall effect device from damaging by-product high-intensity electromagnetic energy, while permitting the device to sense the normal operating magnetic fields produced by current flow in the resistance welding equipment.

At present, nickel provides the best performance; however, substantially similar results may be achieved when other electromagnetically conductive materials, such as those disclosed in the following U.S. Pat. Nos. 3,562,124; 4,517,118 and 3,870,987, all of which are incorporated herein by reference.

While not fully understood, it is believed that the magnetically saturable coating absorbs radio frequency electromagnetic energy before it can reach the Hall effect device. The coating converts the electromagnetic energy into heat which is dissipated into the surrounding atmosphere. The epoxy binder aids heat dissipation by increasing the surface area exposed to the atmosphere and surrounding mounting fixture.

While the invention has been described in connection with the presently preferred embodiment, it will be understood that the invention is susceptible to certain modification and change without departing from the spirit of the invention as set forth in the appended claims.

What is claimed as novel is as follows:

1. A sensor for measuring current in a current carrying component of a resistance welding apparatus which radiates intense electromagnetic energy as a by-product of the welding operation, comprising:

Hall effect device for sensing the magnetic field produced by a current;

means for positioning said device in the magnetic field of said current in said current carrying component; and magnetically saturable coating means on said device for shielding said device from said intense electromagnetic energy while permitting magnetic fields from said current carrying component to be sensed by the Hall effect device, and thereby substantially preventing said energy from damaging said device.

2. The sensor of claim 1 wherein the magnetically saturable coating means comprises a material with non-linear magnetic saturation characteristics.

3. A sensor for measuring current in a current carrying component of a resistance welding apparatus which radiates intense electromagnetic energy as a by-product of the welding operation, comprising:

Hall effect device for sensing the magnetic field produced by a current;

means for positioning said device in the magnetic field of said current in said current carrying component; and ferromagnetic coating means on said device for shielding said device from said intense electromagnetic energy while permitting magnetic fields from said current carrying component to be sensed by the Hall effect device, and thereby substantially preventing said energy from damaging said device.

4. A sensor for measuring current in a current carrying component of a resistance welding apparatus which radiates intense electromagnetic energy as a by-product of the welding operation, comprising:

Hall effect device for sensing the magnetic field produced by a current;

means for positioning said device in the magnetic field of said current in said current carrying component; and ferrimagnetic coating means on said device for shielding said device from said intense electromagnetic energy while permitting magnetic fields from said current carrying component to be sensed by the Hall effect device, and thereby substantially preventing said energy from damaging said device.

5. A sensor for measuring current in a current carrying component of a resistance welding apparatus which radiates intense electromagnetic energy as a by-product of the welding operation, comprising:

Hall effect device for sensing the magnetic field produced by a current;

means for positioning said device in the magnetic field of said current in said current carrying component; and magnetically saturable coating means on said device for absorbing at least a portion of said electromagnetic energy while permitting magnetic fields from said current carrying component to be sensed by the Hall effect device, and thereby substantially preventing said energy from damaging said device.

6. A sensor for measuring current in a current carrying component of a resistance welding apparatus which radiates intense electromagnetic energy as a by-product of the welding operation, comprising:

Hall effect device for sensing the magnetic field produced by a current;

means for positioning said device in the magnetic field of said current in said current carrying component; and ferromagnetic coating on said device, said coating having minimal magnetic flux conduction at magnetic field strengths below a predetermined critical point and having substantial magnetic flux conduction at magnetic field strengths above said critical point.

7. A sensor for measuring current in a current carrying component of a resistance welding apparatus which radiates intense electromagnetic energy as a by-product of the welding operation, comprising:

Hall effect device for sensing the magnetic field produced by a current;

means for positioning said device in the magnetic field of said current in said current carrying component; and electromagnetically saturable coating means on said device for shielding said device from said intense electromagnetic energy while permitting magnetic fields from said current carrying component to be sensed by the Hall effect device, and thereby substantially preventing said energy from damaging said device.

8. The sensor of claim 7 wherein the electromagnetically saturable coating means comprises a material with nonlinear electromagnetic saturation characteristics.

9. A method of making a resistance welding current sensor, comprising:

providing a Hall effect device;

coating said Hall effect device with a saturable magnetic coating; and providing a means for positioning said coated device in a resistance welding apparatus where said device can receive magnetic energy from a current carrying component of said apparatus.

10. The method of claim 9 wherein the step of coating said Hall effect device further comprises the step of dipping the Hall effect device into a liquid material with nonlinear magnetic saturation characteristics which then hardens and adheres to the entire Hall effect device.

11. A method of sensing current in a resistance welding system, comprising:

providing a Hall effect device;

coating said Hall effect device with a saturable magnetic coating; and positioning said coated device in a resistance welding apparatus where said device can receive magnetic energy from a current carrying component of said apparatus.

12. The method of claim 10 wherein the step of coating said Hall effect device further comprises the step of dipping the Hall effect device into a liquid material with nonlinear magnetic saturation characteristics which then hardens and adheres to the entire Hall effect device.

* * * * *

UNITED STATES PATENT AND TRADEMARK OFFICE
CERTIFICATE OF CORRECTION

PATENT NO. : 4,721,840

DATED : January 26, 1988

INVENTOR(S) : Ralph H. Fielding

It is certified that error appears in the above-identified patent and that said Letters Patent is hereby corrected as shown below:

Column 2, line 52, "suturable" should be --saturable--.

Column 3, line 37, "an" should be --a--.

Column 7, line 22, after "material", "." should be --,-- and "Other" should be --other--.

Column 7, line 55, "to" (second occurrence) should be --the--.

Column 10, line 33, claim 12, "10" should be --11--.

Signed and Sealed this

Twenty-eighth Day of June, 1988

Attest:

DONALD J. QUIGG

*Attesting Officer*      *Commissioner of Patents and Trademarks*